United States Patent
Lee et al.

(10) Patent No.: US 9,028,639 B2
(45) Date of Patent: May 12, 2015

(54) METHOD OF MANUFACTURING STAMP FOR PLASMONIC NANOLITHOGRAPHY APPARATUS AND PLASMONIC NANOLITHOGRAPHY APPARATUS

(71) Applicant: Korea Institute of Machinery & Materials, Daejeon (KR)

(72) Inventors: Eung-Sug Lee, Daejeon (KR); Joo Yun Jung, Daejeon (KR); Jun Hyuk Choi, Daejeon (KR); Jae Won Hahn, Seoul (KR)

(73) Assignee: Korea Institute of Machinery & Materials, Daejeon (KR)

( * ) Notice: Subject to any disclaimer, the term of this patent is extended or adjusted under 35 U.S.C. 154(b) by 146 days.

(21) Appl. No.: 13/726,684

(22) Filed: Dec. 26, 2012

(65) Prior Publication Data

US 2013/0340929 A1    Dec. 26, 2013

(30) Foreign Application Priority Data

Jun. 20, 2012    (KR) .................. 10-2012-0066177

(51) Int. Cl.
*B32B 37/26*    (2006.01)
*G03F 7/20*    (2006.01)
(Continued)

(52) U.S. Cl.
CPC .............. *B32B 37/26* (2013.01); *G03F 7/2004* (2013.01); *B81C 2201/0152* (2013.01); *B81C 99/009* (2013.01); *G03F 7/0002* (2013.01); *G03F 7/0017* (2013.01); *B82Y 10/00* (2013.01); *B82Y 40/00* (2013.01)

(58) Field of Classification Search
CPC ......... B32B 37/26; G03F 7/20; G03F 7/2004; G03F 7/0002; B82Y 40/00; B82Y 10/00; B81C 99/009
USPC ......................................... 156/230, 233, 237
See application file for complete search history.

(56) References Cited

U.S. PATENT DOCUMENTS 7,396,566 B2    7/2008    Zschieschang
7,993,800 B2    8/2011    Hyde
(Continued)

FOREIGN PATENT DOCUMENTS

DE    10-2005-000-891    7/2006
JP    2009-051178 A    3/2009
(Continued)

OTHER PUBLICATIONS

International Searching Authority, International Search Report of the corresponding application (PCT/KR2012/011028) (Mar. 20, 2013).
(Continued)

*Primary Examiner* — Daniel McNally
(74) *Attorney, Agent, or Firm* — Lexyoume IP Meister, PLLC (57) ABSTRACT

There is provided a method of manufacturing a stamp for a plasmonic nanolithography apparatus. The method includes forming metal patterns on a substrate, coating a hydrophobic thin film on external surfaces of the metal patterns to hydrophobic processing the external surfaces of the metal patterns, selectively hydrophilic processing only the external surfaces of the metal patterns, laminating a buffer layer on the substrate and the metal patterns, and transcribing the metal patterns and the buffer layer from the substrate to a base formed of light transmission material to be combined with the base.

9 Claims, 9 Drawing Sheets

(51) Int. Cl.
  *B81C 99/00* (2010.01)
  *G03F 7/00* (2006.01)
  *B82Y 10/00* (2011.01)
  *B82Y 40/00* (2011.01)

(56) References Cited

U.S. PATENT DOCUMENTS

| 2005/0098537 | A1 | 5/2005 | Salleo |
| 2008/0131791 | A1 | 6/2008 | Cho |
| 2008/0230773 | A1* | 9/2008 | Dickey et al. ............... 257/40 |
| 2011/0148008 | A1 | 6/2011 | Guo |

FOREIGN PATENT DOCUMENTS

| KR | 10-2001-0072185 A | 7/2001 |
| KR | 10-0620384 B1 | 8/2006 |
| KR | 10-2007-0029762 A | 3/2007 |
| KR | 10-2007-0094743 A | 9/2007 |
| KR | 10-2007-0111922 A | 11/2007 |
| KR | 10-2008-0046986 A | 5/2008 |
| KR | 10-0842931 B1 | 6/2008 |
| KR | 10-0871093 B1 | 9/2008 |
| KR | 10-2008-0101048 | 11/2008 |
| KR | 10-0884811 B1 | 2/2009 |
| KR | 10-2011-0012083 | 2/2011 |

OTHER PUBLICATIONS

Choi, Dae-Geun et al. "Fluorinated Organic-Inorganic Hybrid Mold as a New Stamp for Nanoimprint and Soft Lithography," Langmuir. vol. 25 (21), pp. 9390-9392 (Sep. 3, 2005).

* cited by examiner

METHOD OF MANUFACTURING STAMP FOR PLASMONIC NANOLITHOGRAPHY APPARATUS AND PLASMONIC NANOLITHOGRAPHY APPARATUS

CROSS-REFERENCE TO RELATED APPLICATION

This application claims priority to and the benefit of Korean Patent Application No. 10-2012-0066177 filed in the Korean Intellectual Property Office on Jun. 20, 2012, the entire contents of which are incorporated herein by reference.

BACKGROUND OF THE INVENTION (a) Field of the Invention

The present invention relates to a method of manufacturing a stamp for a plasmonic nanolithography apparatus and a plasmonic nanolithography apparatus. More particularly, the present invention relates to a method of manufacturing a stamp for a plasmonic nanolithography apparatus capable of easily processing a micro pattern and a plasmonic nanolithography apparatus.

(b) Description of the Related Art

A nanoimprint lithography technology is suggested as a technology capable of mass producing nanostructures of no more than 100 nm at a low price. Since only structures of a limited size may be produced by the lithography technology widely used for semiconductor processes and production of microelements due to the limit of light diffraction, a nanoimprint technology is spotlighted as an alternative for solving the problem.

Particularly, since a UV nanoimprint process may be performed at room temperature and under low pressure and may prevent thermal deformation generated in a conventional heating imprint process, the UV nanoimprint process is worthy of being spotlighted. In the UV nanoimprint process, when a master pattern is generated on a transparent mold substrate and the manufactured master contacts resin, resin is filled in a pattern by capillary force and is hardened by irradiating ultraviolet rays and the master is removed.

Although it is possible to transcribe a highly precise pattern and to perform high speed processes, in the UV nanoimprint process, the resin and the master directly contact so that the master is frequently contaminated.

In addition, when the master pattern is formed to have a complicated structure, resin is not sufficiently filled in the master pattern so that quality of the finally formed pattern is deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

Therefore, in order to solve the conventional problem, the object of the present invention is to provide a method of manufacturing a stamp for a plasmonic nanolithography apparatus capable of forming a micro pattern without the limit of light diffraction and a plasmonic nanolithography apparatus.

The object is achieved by a method of manufacturing a stamp for a plasmonic nanolithography apparatus, including forming metal patterns on a substrate, coating a hydrophobic thin film on external surfaces of the metal patterns to hydrophobic processing the external surfaces of the metal patterns, selectively hydrophilic processing only the external surfaces of the metal patterns, laminating a buffer layer on the substrate and the metal patterns, and transcribing the metal patterns and the buffer layer from the substrate to a base formed of light transmission material to be combined with the base.

In addition, the metal patterns may be formed of material having a plasmonic resonance characteristic.

In addition, performing hydrophilic processing may include laminating a polymer layer on the substrate and the metal patterns, removing a part of the polymer layer so that only the metal patterns are exposed to the outside, selectively hydrophilic processing only the external surfaces of the metal patterns exposed to the outside, and removing the entire left polymer layer.

In addition, laminating the polymer layer may include laminating a thin film-shaped polymer layer, plasma processing the laminated polymer so that the laminated polymer has a hydrophilic characteristic, and laminating the polymer to a height of no less than the height of the metal patterns.

In addition, in removing a part of the polymer layer, the polymer may be removed by an etch-back process.

In addition, the method may further include laminating an adhesion preventing layer on surfaces of the polymer layer and the metal patterns separated from the substrate.

In addition, the adhesion preventing layer may be processed to have a hydrophobic or hydrophilic characteristic.

In addition, in forming the metal patterns, the metal patterns may be processed so that an angle between a side surface of the metal pattern and the substrate may be an acute angle.

In addition, before forming the metal patterns, performing hydrophobic processing or adhesion preventing processing on the substrate may be further included.

In addition, the object is achieved by a nanolithography apparatus for exposing a resist using ultraviolet rays, including a chamber, a light source accommodated in the chamber to generate ultraviolet rays, and a stamp including a base formed of light transmission material provided on a light path of the light source, an exposure unit whose one surface is connected to the base to convert ultraviolet rays generated by the light source into Plasmon energy to be transmitted to the resist, and a stamp including an adhesion preventing layer combined with the other section of the exposure unit. The exposure unit includes metal patterns having a plasmonic resonance characteristic.

In addition, the surface of the adhesion preventing layer may have a hydrophilic or hydrophobic characteristic so that the adhesion preventing layer may be easily released from the resist.

According to the present invention, there is provided a plasmonic nanolithography apparatus capable of easily forming a micro pattern on the resist without the limit of light diffraction using surface Plasmon energy.

In addition, a hydrophilic or hydrophobic adhesion preventing layer is formed in the lowermost end of the stamp so that the stamp may be easily released from the resist after performing exposure.

In addition, there is provided a method of manufacturing a stamp for a plasmonic nanolithography apparatus in which the external surfaces of the metal patterns and the external surface of the substrate are processed to have different characteristics so that the stamp may be easily manufactured.

In addition, the metal patterns and the buffer layer may be firmly combined with each other and the substrate and the buffer layer may be easily separated from each other by surface treatment.

In addition, the edges of the metal patterns are processed so that light energy may be concentrated to be transmitted to the resist.

BRIEF DESCRIPTION OF THE DRAWINGS

FIG. 1 schematically illustrates a plasmonic nanolithography apparatus according to an exemplary embodiment of the present invention, FIG. 2 schematically illustrates a process of having a stamp and a resist contact each other in a patterning process using the plasmonic nanolithography of FIG. 1, FIG. 3 schematically illustrates a process of irradiating ultraviolet rays from a light source to perform exposure in the patterning process using the plasmonic nanolithography of FIG. 1, FIG. 4 schematically illustrates a process of releasing the stamp from the resist in the patterning process using the plasmonic nanolithography of FIG. 1, FIG. 5 schematically illustrates the resist in which a predetermined pattern is formed by the patterning process using the plasmonic nanolithography of FIG. 1.

DETAILED DESCRIPTION OF THE EMBODIMENTS

Hereinafter, a plasmonic nanolithography apparatus according to an exemplary embodiment of the present invention will be described in detail with reference to the accompanying drawings.

Figure 1:
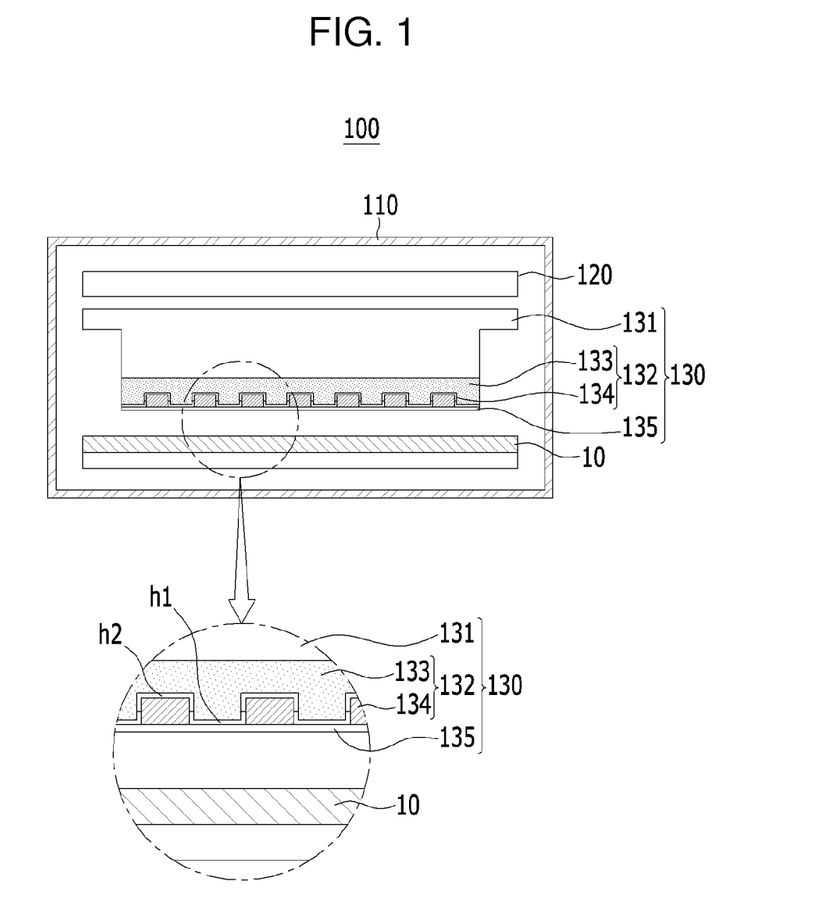

FIG. 1 schematically illustrates a plasmonic nanolithography apparatus according to an exemplary embodiment of the present invention.

Referring to FIG. 1, a plasmonic nanolithography apparatus 100 according to the present invention for patterning a micro pattern includes a chamber 110, a light source 120, and a stamp 130.

In the chamber 110, a stamp 130 to be described later, a light source 120, and a resist 10 to be patterned are disposed and an exposure process is performed.

The light source 120 is accommodated in a vacuum chamber to provide ultraviolet rays to the stamp to be described later to expose the resist 10.

The stamp 130 provided in a region between the above-described light source 120 and resist 10 in the chamber 110 includes a base 131, an exposure unit 132, and an adhesion preventing layer 135.

The base 131 disposed below the light source 120 in the chamber 110, that is, on the light path of ultraviolet rays generated by the light source 120 is formed of quartz according to the present embodiment. However, any material having excellent light transmission may be used without being limited to the above in order to transmit ultraviolet rays.

The exposure unit 132 for converting surface Plasmon energy from ultraviolet rays that pass through the base 131 includes a buffer layer 133 and metal patterns 134.

The buffer layer 133 supports the metal patterns 134 to be described later with the metal patterns 134 inserted thereinto. One section of the buffer layer 133 that forms a flat surface is connected to the above-described base 131 and the other section of the buffer layer 133 is connected to the adhesion preventing layer 135 to be described later. In the present exemplary embodiment, the buffer layer 133 is formed of resin formed of photocurable material to be processed. However, the present invention is not limited to the above.

The plurality of metal patterns 134 for absorbing ultraviolet rays to form a resonance energy electromagnetic field are inserted into the buffer layer 133 to be separated from each other. On the other hand, the metal patterns 134 are exposed and developed to be arranged in consideration of the shape of a pattern to be finally formed in the resist 10.

In addition, in the present exemplary embodiment, gold or silver is used as the material of the metal patterns 134. However, any material having a plasmonic resonance characteristic may be used without being limited to the above.

The sections of the metal patterns 134 are exposed through the buffer layer 133 of the opposite surface to the surface that contacts the base 131. The sections of the buffer layer 133 and the metal patterns 134 are processed as flat surfaces in order to have the sections of the buffer layer 133 and the metal patterns 134 uniformly contact the resist 10 during the exposure process.

On the other hand, the buffer layer 133 of the above-described stamp 130 is firmly combined with the metal patterns 134 having hydrophilic surfaces.

The adhesion preventing layer 135 uniformly connected to the surface of the buffer layer 133 opposite to the surface that contacts the base 131 has the stamp 130 easily released from the resist 10 during the exposure process.

On the other hand, in the present exemplary embodiment, in order to easily release the stamp 130 from the hydrophobic resist 10 and to prevent the master pattern from being contaminated, the adhesion preventing layer 135 may be formed of hydrophilic material or the exposed surface of the adhesion preventing layer 135 may be processed so that the exposed surface has a hydrophilic characteristic.

In addition, the adhesion preventing layer 135 may be formed of hydrophobic material in accordance with the characteristic of the resist 10 or may be processed so that the surface of the adhesion preventing layer 135 has a hydrophobic characteristic.

Therefore, according to the present exemplary embodiment, a micro pattern may be easily formed on the resist without difficulties generated by the limit of light diffraction.

Hereinafter, the operation of an exemplary embodiment of the above-described plasmonic nanolithography apparatus 100 will be described.

Figure 2:
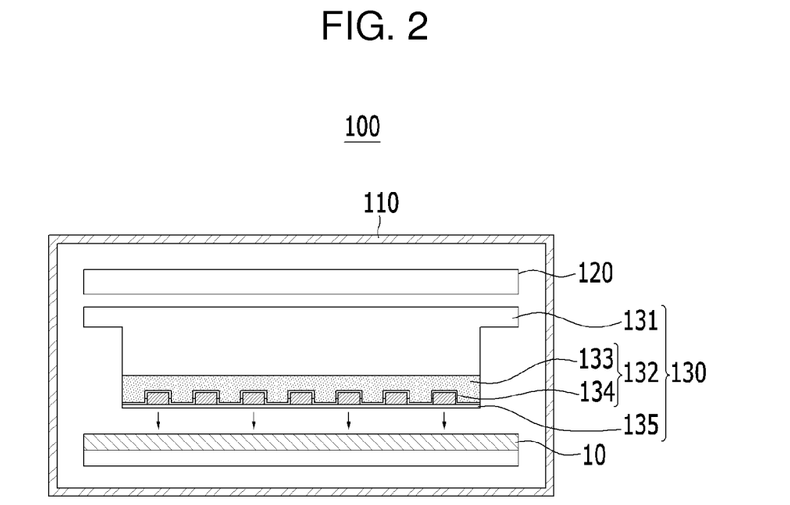

FIG. 2 schematically illustrates a process of having a stamp and a resist contact each other in a patterning process using the plasmonic nanolithography of FIG. 1.

First, as shown in FIG. 1, after disposing the resist 10 to be patterned in the chamber 110, the stamp 130 is moved to the resist 10 below the stamp 130 in the vacuum chamber 110 so that the lower end of the stamp 130 contacts the resist 10. That is, the adhesion preventing layer 135 firmly contacts the resist 10 by the movement of the above-described stamp 130.

At this time, when the stamp 130 contacts the resist 10, air is prevented from being flown to the space between the resist 10 and the stamp 130 so that the inside of the chamber 110 preferably remains vacuous.

Figure 3:
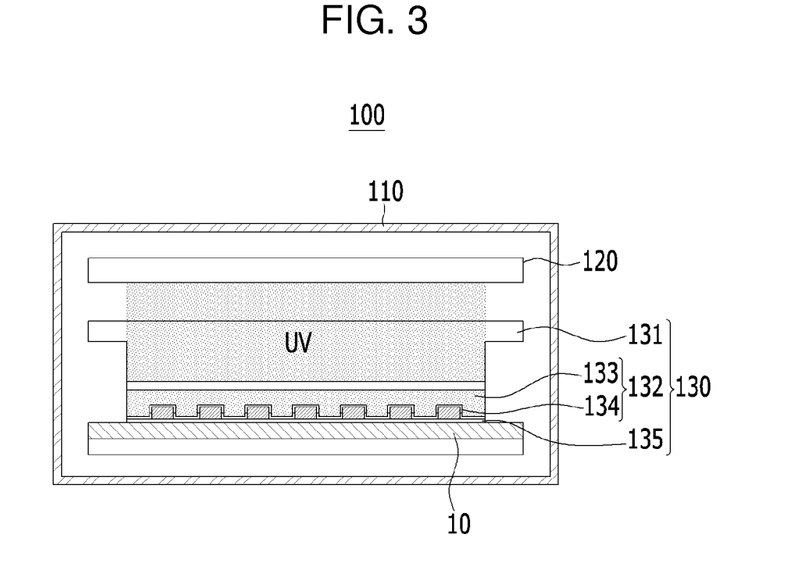

FIG. 3 schematically illustrates a process of irradiating ultraviolet rays from a light source to perform exposure in the patterning process using the plasmonic nanolithography of FIG. 1.

As shown in FIG. 3, when contact between the stamp 130 and the resist 10 is completed by the above-described process, ultraviolet rays are generated by the light source 120 so that the inside of the chamber 110 maintains high temperature. At this time, the temperature of the inside of the chamber 110 is preferably set to be no more than the glass transition temperature of the resist 10 so that the photosensitive characteristic of the resist 10 to be patterned is not changed.

Ultraviolet rays generated by the light source 120 pass through the base 131 formed of excellent light transmission material along the light path under the base 131 to reach the metal patterns 134. When resolution of the metal patterns 134 is refined, ultraviolet photons pass through openings (apertures) among the metal patterns not to reach the resist 10 but to be absorbed into the metal patterns 134. At this time, absorbed light energy is combined with free electrons of the surfaces of the metal patterns 134 to be converted into surface Plasmon energy. A strong plasmonic electromagnetic field is formed under a resonance wavelength condition to affect the resist 10 positioned in a near field so that exposure may be performed while breaking the chemical bond of the resist 10.

That is, as described above, the surface Plasmon energy into which ultraviolet rays are converted after being combined with the free electrons of the surfaces of the metal patterns 134 exposes the resist 10 and the resist 10 is exposed in accordance with the shape of the openings of the metal patterns 134.

Figure 4:
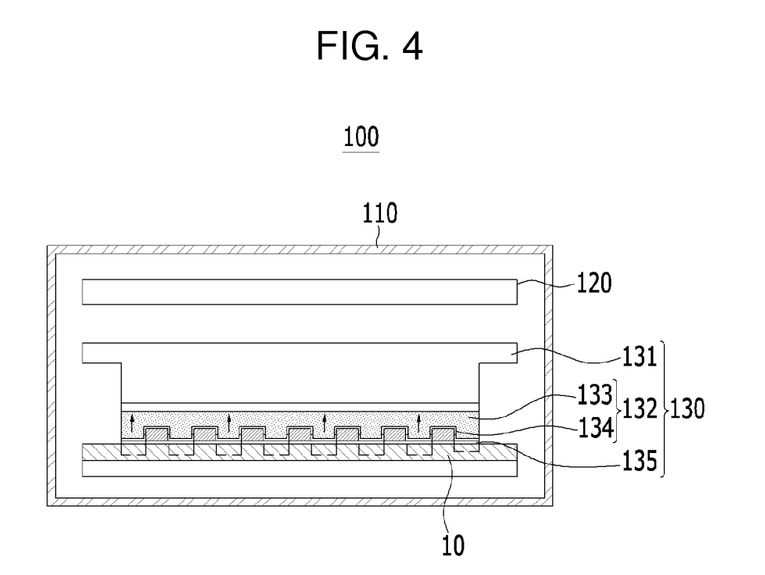

FIG. 4 schematically illustrates a process of releasing the stamp from the resist in the patterning process using the plasmonic nanolithography of FIG. 1.

As shown in FIG. 4, when the exposure process is completed by ultraviolet rays, the stamp 130 is released from the resist 10. At this time, the stamp 130 may be easily released from the resist 10 due to the adhesion preventing layer 135 connected to the vertical section thereof.

Figure 5:
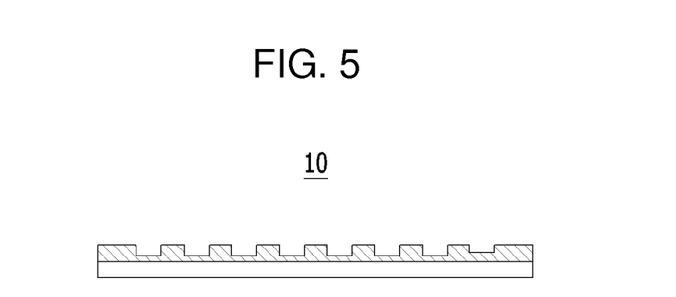

FIG. 5 schematically illustrates the resist in which a predetermined pattern is formed by the patterning process using the plasmonic nanolithography of FIG. 1.

As shown in FIG. 5, the exposed resist 10 forms a final pattern corresponding to the shape of arrived light after undergoing a developing process.

Hereinafter, a method S100 of manufacturing a stamp for a plasmonic nanolithography apparatus according to a first exemplary embodiment of the present invention will be described.

Figure 6:
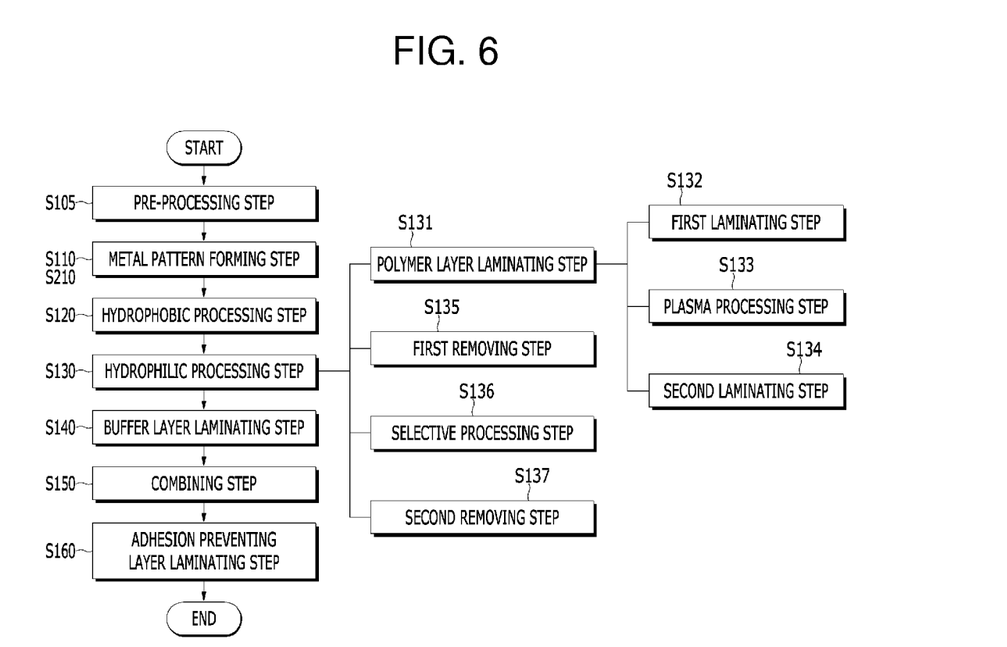
FIG. 6 is a schematic process flowchart of methods of manufacturing a stamp for a plasmonic nanolithography apparatus according to first and second exemplary embodiments of the present invention, FIG. 7 schematically illustrates a metal pattern forming process of the method of manufacturing a stamp for a plasmonic nanolithography apparatus of FIG. 5, FIG. 8 schematically illustrates a hydrophobic processing process of the method of manufacturing a stamp for a plasmonic nanolithography apparatus of FIG. 5, FIG. 9 schematically illustrates a polymer layer laminating process of the method of manufacturing a stamp for a plasmonic nanolithography apparatus of FIG. 5, FIG. 10 schematically illustrates a hydrophilic processing process of the method of manufacturing a stamp for a plasmonic nanolithography apparatus of FIG. 5, FIG. 11 schematically illustrates a buffer layer laminating process of the method of manufacturing a stamp for a plasmonic nanolithography apparatus of FIG. 5, FIG. 12 schematically illustrates a combining process of the method of manufacturing a stamp for a plasmonic nanolithography apparatus of FIG. 5, FIG. 13 schematically illustrates an adhesion preventing layer of the method of manufacturing a stamp for a plasmonic nanolithography apparatus of FIG. 5, FIG. 14 schematically illustrates a metal pattern forming process of the method of manufacturing a stamp for a plasmonic nanolithography apparatus according to the second exemplary embodiment of the present invention.

FIG. 6 is a schematic process flowchart of methods of manufacturing a stamp for a plasmonic nanolithography apparatus according to first and second exemplary embodiments of the present invention.

Referring to FIG. 6, the method S100 of manufacturing a stamp for a plasmonic nanolithography apparatus according to an exemplary embodiment of the present invention includes processes of manufacturing the stamp 130 that uniformly surface contacts the resist 10 such as a pre-processing step S105, a metal pattern forming step S110, a hydrophobic processing step S120, a hydrophilic processing step S130, a buffer layer laminating step S140, a combining step S150, and an adhesion preventing layer laminating step S160.

In the pre-processing step S105, hydrophobic processing or adhesion preventing processing is performed in a region on a substrate 20 where the metal patterns 134 are formed before forming the metal patterns 134 in the following metal pattern forming step S110.

That is, in the present step, hydrophobic processing or adhesion preventing processing is performed in the interface between the substrate 20 and the metal patterns 134 so that the metal patterns 134 may be easily released from the substrate 20 in the following combining step S150.

Figure 7:
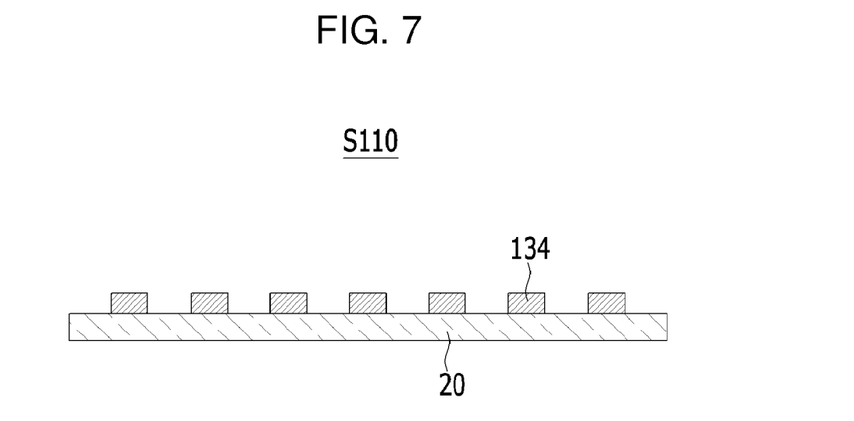

FIG. 7 schematically illustrates a metal pattern forming process of the method of manufacturing a stamp for a plasmonic nanolithography apparatus of FIG. 5.

Referring to FIG. 7, in the metal pattern forming step S110, the metal patterns 134 having the plasmonic resonance characteristic are patterned on the substrate 20.

In the present step, the metal patterns 134 are formed on the substrate 20. In the present step, gold or silver is used as material of the metal patterns 134. However, any material having the plasmonic resonance characteristic may be used without being limited to the above.

In addition, in the present embodiment, the metal patterns 134 are formed on the substrate 20 by a lift-off process or a metal direct etching process. However, a process of processing the metal patterns 134 is not limited to the above.

Figure 8:
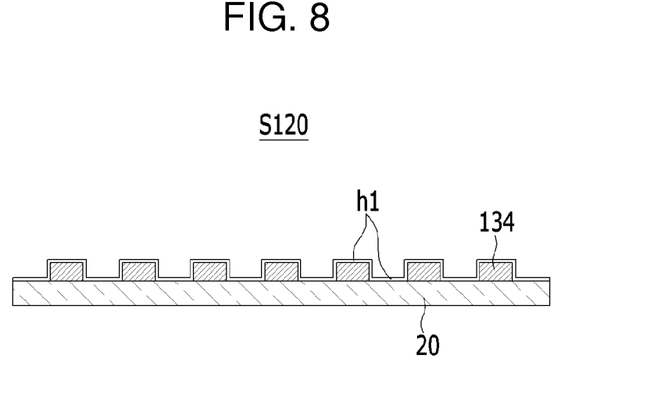

FIG. 8 schematically illustrates a hydrophobic processing process of the method of manufacturing a stamp for a plasmonic nanolithography apparatus of FIG. 5.

Referring to FIG. 8, in the hydrophobic processing step S120, the substrate 20 and the external surfaces of the metal patterns 134 formed on the substrate 20 are hydrophobic processed. In the present step, the exposed surfaces of the substrate 20 and the metal patterns 134 are hydrophobic processed through a plasma processing process. However, the present invention is not limited to the above but hydrophobic processing may be performed by a method of depositing a silane or single molecular layer.

On the other hand, hereinafter, in the drawing, a hydrophobic processed surface h1 and a hydrophilic processed surface h2 are separated and illustrated.

Figure 9:
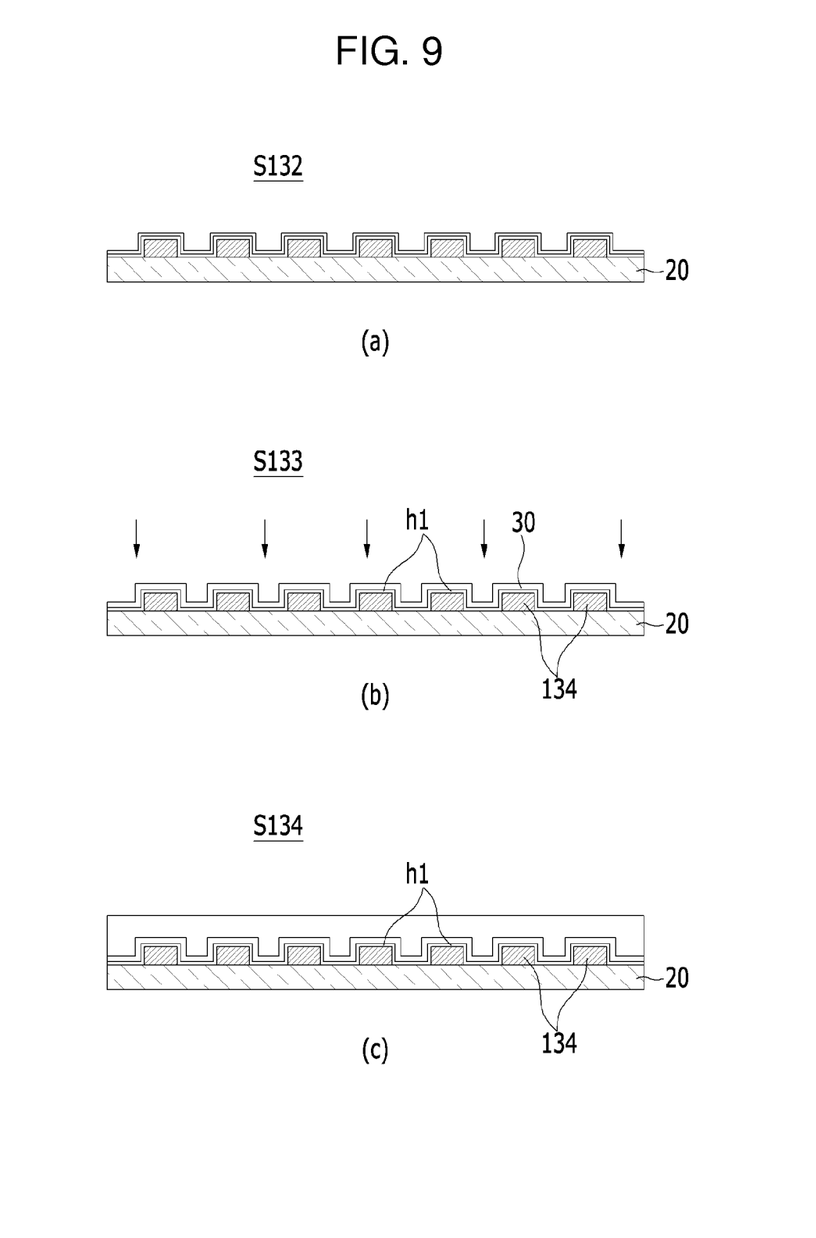
Figure 10:
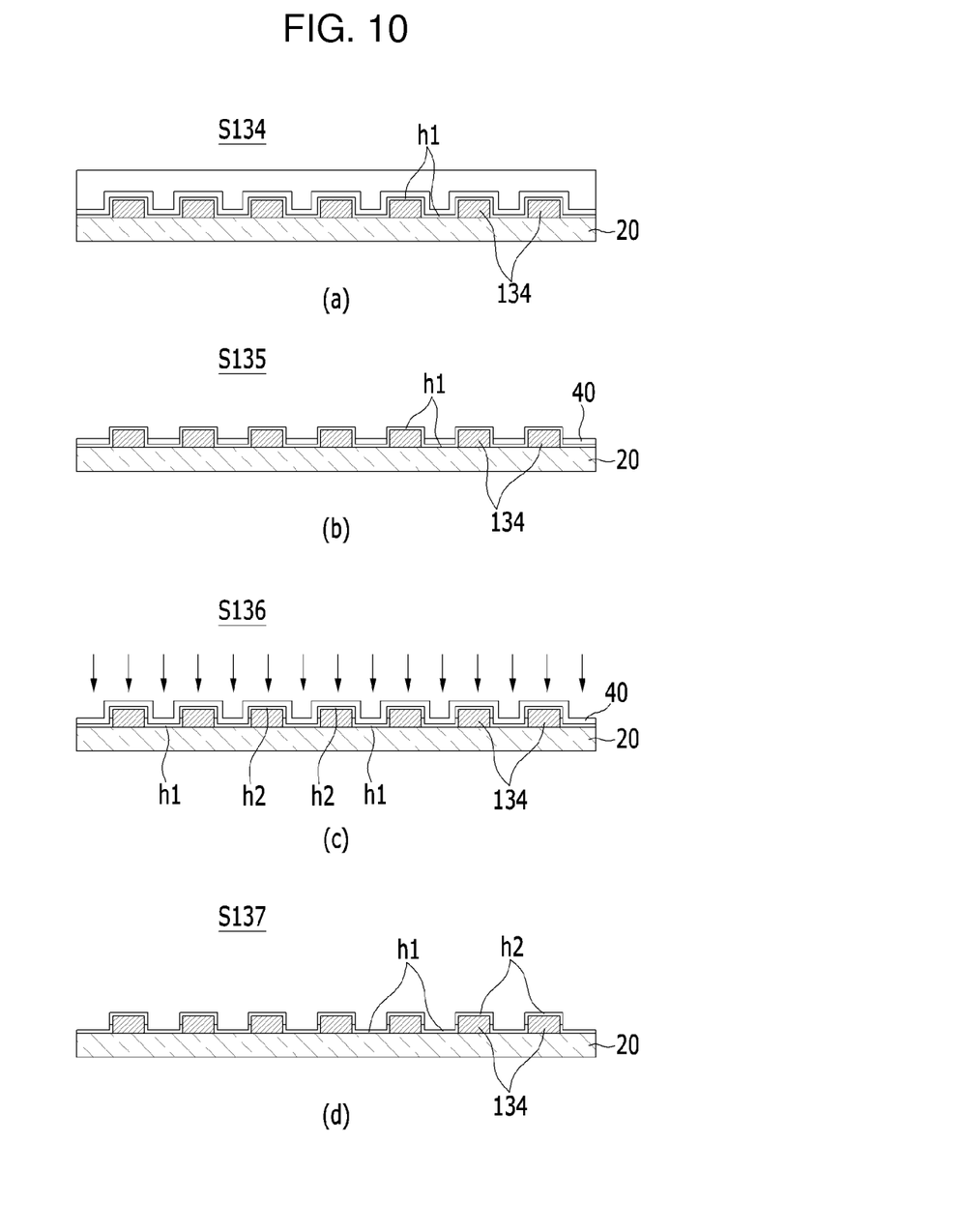

FIG. 9 schematically illustrates a polymer layer laminating process of the method of manufacturing a stamp for a plasmonic nanolithography apparatus of FIG. 5. FIG. 10 schematically illustrates a hydrophilic processing process of the method of manufacturing a stamp for a plasmonic nanolithography apparatus of FIG. 5

In the hydrophilic processing step S130, processes of selectively hydrophilic processing only the surfaces of the metal patterns 134 include a polymer layer laminating step S131, a first removing step S135, a selectively processing step S136, and a second removing step S137.

The polymer layer laminating step S131 of exposing only the surfaces of the metal patterns 134 to be hydrophilic processed to the outside and of protecting the external surface of the remaining substrate 20 includes a first laminating step S132, a plasma processing step S133, and a second laminating step S134.

As illustrated in FIG. 9(a), the first laminating step S132 corresponds to a pre-processing process of laminating a thin film-shaped polymer layer 30 on the substrate 20 in order to laminate a polymer layer 40 on the substrate. That is, when the polymer layer 40 is directly laminated on the external surfaces of the substrate 20 and the metal patterns 134 in the state where the surfaces are hydrophobic processed, since it is difficult to laminate the polymer layer 40 of a desired height, the thin film-shaped polymer layer 30 is previously laminated.

In the present exemplary embodiment, the first laminating step S132 is performed by a spin coating method of low rotation speed of no more than 2000 rpm.

As illustrated in FIG. 9(b), since the surface of the thin film-shaped polymer layer 30 is plasma processed to be hydrophilic processed in the plasma processing step 133, the polymer layer 40 of a desired height may be smoothly laminated on the thin film-shaped polymer layer 30.

As illustrated in FIG. 9(c), in the second laminating step S134, polymer of the same material is additionally coated on the hydrophilic processed thin film-shaped polymer layer 40 so that the polymer layer 40 of a desired height is finally laminated. Therefore, in the polymer layer laminating step S131, the polymer layer 40 of a desired height may be finally laminated by the pre-processing process including the first laminating step S132 and the plasma processing step S133.

In the present exemplary embodiment, the second laminating step S134 is performed by a spin coating method of high rotation speed of no less than 4000 rpm.

On the other hand, the polymer layer 40 finally laminated in the polymer layer laminating step S131 is laminated with a height larger than the metal patterns 134 so that the metal patterns 134 are not exposed to the outside.

As illustrated in FIG. 10(b), in the first removing step S135, a part of the finally laminated polymer layer 40 is removed to expose the surfaces of the metal patterns 134 to the outside. That is, in the present step, the upper region of the polymer layer 40 is removed with only the lowermost end of the polymer layer 40 left on the substrate 20 so that the metal patterns 134 are exposed to the outside and that the substrate 20 having the surface of a hydrophobic characteristic is protected in the polymer layer 40.

On the other hand, in the first removing step S135, a part of the polymer layer 40 is removed by an etch-back process. However, the present invention is not limited to the above.

As illustrated in FIG. 10(c), in the selectively processing step S136, the surfaces of the metal patterns 134 exposed in the first removing step S135 are selectively hydrophilic processed. That is, in the present step, by performing hydrophilic processing, the top surface of the substrate 20 protected in the polymer layer 40 maintains a hydrophobic characteristic and only the surfaces of the metal patterns 134 exposed to the outside are hydrophilic processed.

On the other hand, hydrophilic processing in the present step is not limited but is preferably performed by one of acid liquid processing, plasma surface processing, and lamination of a monomer-based single molecular layer.

As illustrated in FIG. 10(d), in the second removing step 137, the polymer layer 40 left without being removed is removed to expose the substrate 20 having the hydrophobic surface to the outside. That is, in the present step, the top surface of the substrate 20 has a hydrophobic characteristic and the surfaces of the metal patterns 134 have a hydrophilic characteristic so that the substrate 20 has a different surface characteristic from the metal patterns 134.

Figure 11:
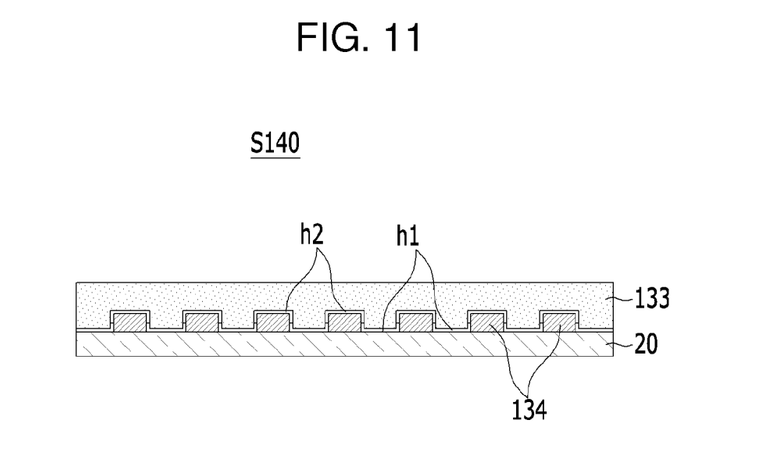

FIG. 11 schematically illustrates a buffer layer laminating process of the method of manufacturing a stamp for a plasmonic nanolithography apparatus of FIG. 5.

Referring to FIG. 11, in the buffer layer laminating step S140, the buffer layer 133 is laminated on the metal patterns 134 and the substrate 20 having different surface characteristics. In the present step, the buffer layer 133 for supporting the metal patterns 134 is laminated by coating and hardening photocurable resin.

Figure 12:
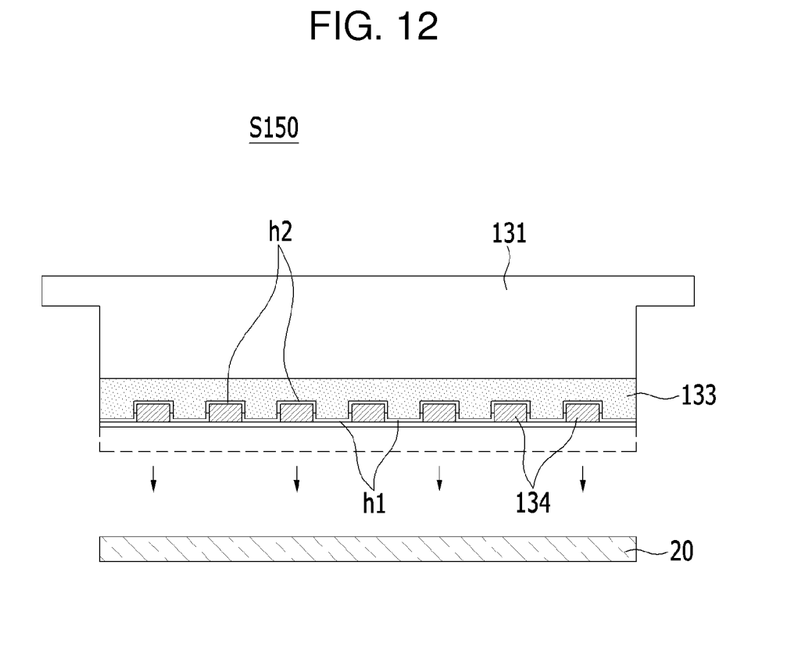

FIG. 12 schematically illustrates a combining process of the method of manufacturing a stamp for a plasmonic nanolithography apparatus of FIG. 5.

Referring to FIG. 12, in the combining step S150, a combination of the buffer layer 133 and the metal patterns 134 is transcribed from the substrate 20 to the base 131 formed of light transmission material.

That is, in the present step, the metal patterns 134 and the buffer layer 133 laminated on the metal patterns 134 are released from the substrate 20 and are combined with the base 131. At this time, since the surface of the substrate 20 is hydrophobic processed by the above process, the substrate 20 is easily released from the buffer layer 133. Since the surfaces of the metal patterns 134 have a hydrophilic characteristic, the metal patterns 134 are firmly combined with the buffer layer 133.

In addition, in the above-described pre-processing step S105, since hydrophobic processing or adhesion preventing processing is performed on the space between the substrate 20 and the metal patterns 134, the substrate 20 and the metal patterns 134 may be easily separated from each other.

Therefore, the buffer layer 133 and the metal patterns 134 that are firmly combined with each other are easily released from the substrate 20 to be transcribed to the base 131 and to be combined with the base 131.

In addition, the surfaces of the metal patterns 134 and the buffer layer 133 released from the substrate 20 are separated from the substrate 20 after contacting the substrate 20, the surfaces of the metal patterns 134 and the buffer layer 133 have excellent flatness.

Figure 13:
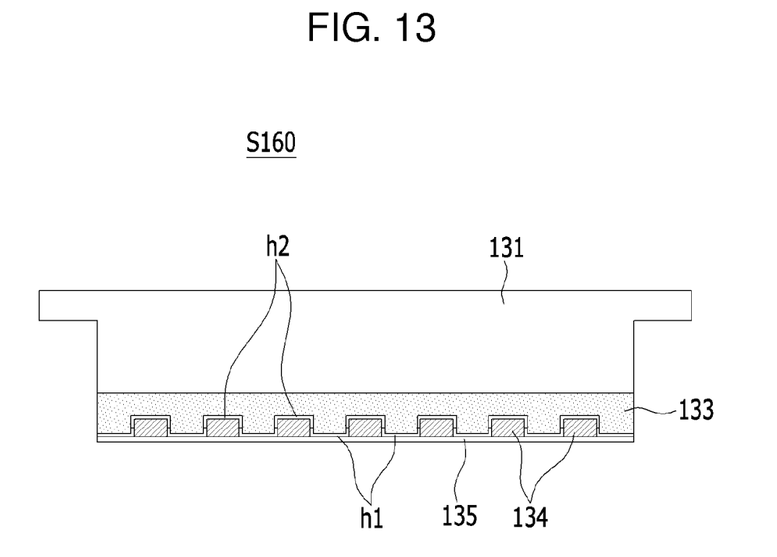

FIG. 13 schematically illustrates an adhesion preventing layer of the method of manufacturing a stamp for a plasmonic nanolithography apparatus of FIG. 5.

Referring to FIG. 13, in the adhesion preventing layer laminating step S160, the adhesion preventing layer 135 is laminated on the surfaces of the metal patterns 134 and the buffer layer 133 released from the substrate 20 to have excellent flatness. That is, the adhesion preventing layer 135 laminated in the present step is interposed between the resist 10 and the buffer layer 133 and the metal patterns 134 in the exposure process so that the resist 10 may be easily released from the buffer layer 133 and the metal patterns 134.

In addition, in the present embodiment, the adhesion preventing layer 135 is formed of hydrophilic material or is processed so that the surface thereof has a hydrophilic characteristic so that the adhesion preventing layer 135 may be easily released from the hydrophobic resist 10.

In accordance with the characteristic of the resist 10, the adhesion preventing layer 135 may be formed of a hydrophobic material or may be processed so that the surface thereof has a hydrophobic characteristic.

Therefore, in the stamp 130 manufactured by the present exemplary embodiment, since the surface that directly contacts the resist 10 has excellent flatness, the stamp 130 may firmly contact the resist 10 and may be easily released from the resist 10 by the adhesion preventing layer 135 after performing exposure.

Next, a method S200 of manufacturing a stamp for a plasmonic nanolithography apparatus according to a second exemplary embodiment of the present invention will be described.

FIG. 6 is a schematic process flowchart of methods of manufacturing a stamp for a plasmonic nanolithography apparatus according to first and second exemplary embodiments of the present invention.

Referring to FIG. 6, the method S200 of manufacturing a stamp for a plasmonic nanolithography apparatus according to an exemplary embodiment of the present invention includes processes of manufacturing a uniform contact type stamp such as a metal pattern forming step S210, a hydrophobic processing step S120, a hydrophilic processing step S130, a buffer layer laminating step S140, a combining step S150, and an adhesion preventing layer laminating step S160. In the present exemplary embodiment, since only the metal pattern forming step S210 is different from the first exemplary embodiment, only the metal pattern forming step S210 will be described.

Figure 14:
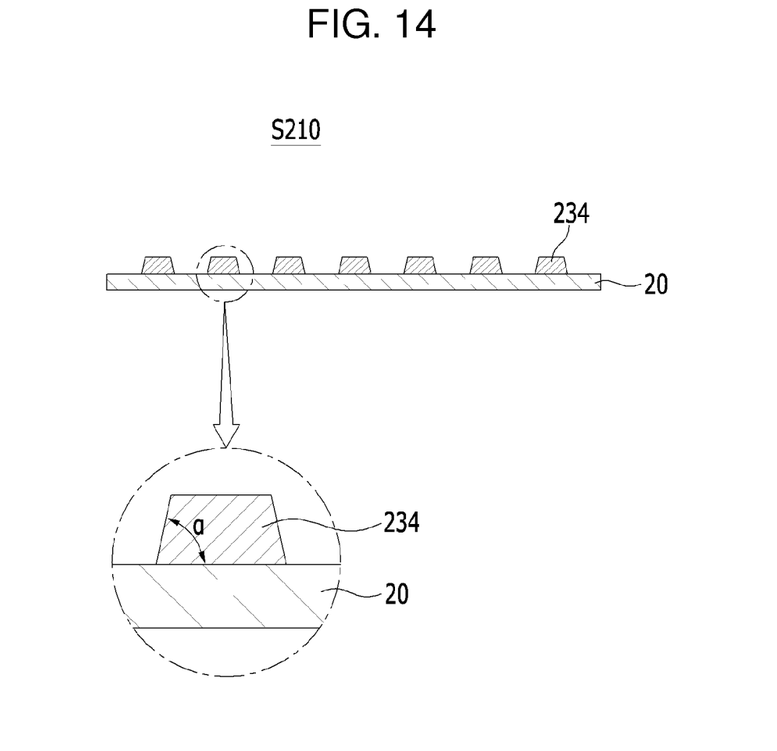

FIG. 14 schematically illustrates a metal pattern forming process of the method of manufacturing a stamp for a plasmonic nanolithography apparatus according to the second exemplary embodiment of the present invention.

In the metal pattern forming step S210, metal patterns 234 having a plasmonic resonance characteristic are formed on the substrate 20. At this time, in the present exemplary embodiment, gold or silver is used as material of the metal patterns 234. However, any metal material having a plasmonic resonance characteristic may be used without being limited to the above.

On the other hand, as shown in FIG. 4, in the metal pattern forming step S210 of the present exemplary embodiment, the edges of the metal patterns 234 are processed so that the angle α of the lower edge is an acute angle and that the vertical section is trapezoidal.

That is, the metal patterns 234 processed in the present step generate a plasmonic resonance phenomenon during the exposure process so that electromagnetism is concentrated on the lower edges of the metal patterns and that light energy may be transmitted to the lower end of the resist.

The scope of the present invention is not limited to the above-described exemplary embodiments but may be realized by various exemplary embodiments within the range of the appended claims. It is to be understood that the invention covers various modifications and equivalent arrangements that may be made by a person of ordinary skill in the art without deviating the main subject of the present invention.

DESCRIPTION OF SYMBOLS

110: chamber
120: light source
130: stamp
131: base
132: exposure unit
133: buffer layer
134: metal pattern
135: adhesion preventing layer

What is claimed is:

1. A method of manufacturing a stamp for a plasmonic nanolithography apparatus, comprising:
    forming metal patterns on a substrate;
    coating a hydrophobic thin film on external surfaces of the substrate and the metal patterns;
    selectively hydrophilic processing only the external surfaces of the metal patterns;
    laminating a buffer layer on the substrate and the metal patterns; and
    transcribing the metal patterns and the buffer layer from the substrate to a base formed of light transmission material to be combined with the base.

2. The method of claim 1, wherein performing hydrophilic processing comprises:
    laminating a polymer layer on the substrate and the metal patterns;
    removing a part of the polymer layer so that only the metal patterns are exposed to the outside;
    selectively hydrophilic processing only the external surfaces of the metal patterns exposed to the outside; and
    removing the entire left polymer layer.

3. The method of any one of claim 2, further comprising laminating an adhesion preventing layer on surfaces of the polymer layer and the metal patterns separated from the substrate.

4. The method of claim 3, wherein the adhesion preventing layer is processed to have a hydrophobic or hydrophilic characteristic.

5. The method of claim 3, wherein, in forming the metal patterns, the metal patterns are processed so that an angle between a side surface of the metal pattern and the substrate is an acute angle.

6. The method of claim 3, before forming the metal patterns, further comprising performing hydrophobic processing or adhesion preventing processing on the substrate.

7. The method of claim 2, wherein laminating the polymer layer comprises:
    laminating a thin film-shaped polymer layer;
    plasma processing the laminated polymer so that the laminated polymer has a hydrophilic characteristic; and
    laminating the polymer to a height of no less than the height of the metal patterns.

8. The method of claim 2, wherein, in removing a part of the polymer layer, the polymer is removed by an etch-back process.

9. The method of claim 1, wherein the metal patterns are formed of material having a plasmonic resonance characteristic.

* * * * *